United States Patent
Sekine

(10) Patent No.: US 9,077,288 B2
(45) Date of Patent: Jul. 7, 2015

(54) AMPLIFIER CIRCUIT AND IMAGE SENSOR USING AMPLIFIER CIRCUIT

(71) Applicant: NLT Technologies Ltd., Kanagawa (JP)

(72) Inventor: Hiroyuki Sekine, Kanagawa (JP)

(73) Assignee: NLT TECHNOLOGIES, LTD., Kanagawa (JP)

( * ) Notice: Subject to any disclaimer, the term of this patent is extended or adjusted under 35 U.S.C. 154(b) by 0 days.

(21) Appl. No.: 14/278,745

(22) Filed: May 15, 2014

(65) Prior Publication Data

US 2014/0339432 A1    Nov. 20, 2014

(30) Foreign Application Priority Data

May 17, 2013    (JP) ................................ 2013-105641

(51) Int. Cl.
| | |
|---|---|
| G01T 1/20 | (2006.01) |
| H03F 3/16 | (2006.01) |
| H04N 5/32 | (2006.01) |
| H04N 5/3745 | (2011.01) |
| H01L 27/146 | (2006.01) |

(52) U.S. Cl.
CPC .. *H03F 3/16* (2013.01); *H04N 5/32* (2013.01); *H04N 5/3745* (2013.01); *H01L 27/14609* (2013.01); *H01L 27/14658* (2013.01)

(58) Field of Classification Search
CPC .......... H03F 3/16; G01T 1/2018; G01T 1/247
USPC ....................................................... 250/366
See application file for complete search history.

(56) References Cited

U.S. PATENT DOCUMENTS

| | | | |
|---|---|---|---|
| 6,441,852 B1* | 8/2002 | Levine et al. ................. 348/302 |
| 2001/0030704 A1* | 10/2001 | Kimura ......................... 348/308 |
| 2004/0135913 A1* | 7/2004 | Shinotsuka et al. .......... 348/308 |
| 2007/0126668 A1* | 6/2007 | Kimura ........................... 345/76 |
| 2011/0128428 A1* | 6/2011 | Takatoku et al. ............. 348/307 |
| 2014/0267854 A1* | 9/2014 | Shishido et al. .............. 348/300 |

FOREIGN PATENT DOCUMENTS

| | | |
|---|---|---|
| JP | 56-138963 | 10/1981 |
| JP | 58-68968 | 4/1983 |
| JP | 04-206573 | 7/1992 |
| JP | 11-211832 | 8/1999 |

OTHER PUBLICATIONS

Noble, "Self-Scanned Silicon Image Detector Arrays", Apr. 1968, IEEE Transaction of Electron Devices, vol. ED-15, No. 4, pp. 206., Fig. 11.

* cited by examiner

*Primary Examiner* — David J Makiya
*Assistant Examiner* — Taeho Jo
(74) *Attorney, Agent, or Firm* — Young & Thompson

(57) ABSTRACT

There is a problem that in an image sensor including an amplifier in each pixel, when a thin-film semiconductor is used as a transistor constituting the amplifier, voltage continues to be applied between source and gate of the transistor and thereby a threshold voltage value of the transistor varies, resulting in a variation of signal voltage. To solve the problem, a thin-film transistor formed with an oxide semiconductor is used as the transistor constituting the amplifier, and during a period other than a period of outputting an output of the amplifier, source potential of the transistor is controlled to be equal to drain potential thereof.

9 Claims, 16 Drawing Sheets

AMPLIFIER CIRCUIT AND IMAGE SENSOR USING AMPLIFIER CIRCUIT

TECHNICAL FIELD

The present invention relates to an amplifier circuit and an image sensor using an amplifier circuit, and in particular, to an amplifier circuit used in an image sensor for a radiation imaging apparatus.

BACKGROUND ART

Techniques for non-destructively inspecting interior of a subject to be examined using a radiolucent image has become techniques necessary in a medical field, an industrial non-destructive inspection field, and the like. Especially, an X-ray image sensor directly taking a radiolucent image as electronic data has been widely used due to promptness of imaging, reading assistance by image processing, capability for responding to moving images, and others. A device mainly used as this X-ray image sensor is one referred to as an FPD (Flat Panel Detector). In the FPD, a photoelectric converter for converting X-rays into electric charge and a switching element for externally taking signal charge accumulated in the photoelectric converter are disposed in each pixel two-dimensionally arranged. The FPD is produced on a large-area substrate such as glass using a thin-film semiconductor technique. The reason is that since it is difficult to produce a reduced optical system for X-rays unlike visible light, a scale of the FPD needs to be at least the same as a subject to be examined. Therefore, as the switching element disposed in a pixel, a TFT (Thin-Film Transistor) is used.

The FPD is roughly divided into two types based on difference in types of converting X-rays into electric charge. One type is an indirect conversion type that converts X-rays into fluorescence to be converted into charge, and the other type is a direct conversion type that directly converts X-rays into charge.

Patent Literature 1 has disclosed, in FIG. 1, a structure as a conventional example of an FPD of the indirect conversion type. This example has a structure where a phosphor layer is laminated on a formation part of a photodiode and a transistor via an insulating film. Fluorescence is emitted from the phosphor layer by X-ray irradiation and then converted into charge by the photodiode. Further, Patent Literature 1 has disclosed an example, in which the photodiode and the transistor used here is formed with a-Si (amorphous silicon).

Patent Literature 2 has disclosed, in FIG. 1, a structure as a conventional example of an FPD of the direct conversion type. This example has a structure where each pixel including a transistor connected to a photoconductive layer is formed on a substrate. X-rays are absorbed by the photoconductive layer and then directly converted into charge. Further, Patent Literature 2 has disclosed examples using ZnO, CdS, CdSe, and the like as the photoconductive layer. In the FPDs of both types, a signal is output as electric charge, converted into voltage in a signal detection circuit such as an integrator externally disposed, and then digitized.

Over recent years, in a medical field, lower exposure and higher definition have been strongly desired for an X-ray diagnostic apparatus. When X-ray irradiation amount is reduced for lower exposure, signal charge detected by the FPD is also decreased, resulting in S/N ratio degradation. Further, even when a pixel size of the FPD is reduced for higher definition, signal charge is also decreased in accordance with this reduction, resulting in S/N ratio degradation. In other words, to achieve both lower exposure and higher definition, it is necessary to increase S/N ratio of the FPD.

As a technique for increasing S/N ratio of an image sensor, available is a technique referred to as APS (Active Pixel Sensor) being applied to a CMOS image sensor. This APS is a technique having been already proposed in the initial stage of developing solid-state imaging devices, and the contents thereof are described, for example, in Non Patent Literature 1. FIG. 16 illustrates a circuit diagram of a pixel according to the APS technique described in Non Patent Literature 1. The following operation is performed in this technique: during a period when COLUMN PULSE n and LINE PULSE m cause transistors T4 and T5 to be in conduction state, voltage of a diode D1 is output to COMMON OUTPUT being an output wiring, by a transistor T3. In other words, a signal is amplified by the transistor T3 and buffered to be output. Therefore, in an output wiring and the like, noise is hardly mixed, resulting in possibility of obtaining high S/N ratio.

Patent Literature 3 and Patent Literature 4 have disclosed methods as conventional examples of an image sensor applying the abovementioned APS technique to a thin-film semiconductor. The method disclosed in Patent Literature 3 is a method using an a-Si TFT as a transistor for amplifying a signal. And, the method disclosed in Patent Literature 4 is a method using a polycrystalline Si TFT as a transistor for amplifying a signal.

CITATION LIST

Patent Literature

Patent Literature 1: Japanese Patent Publication No. H4-206573, FIG. 4 and FIG. 5.
Patent Literature 2: Japanese Patent Publication No. H11-211832, FIG. 1.
Patent Literature 3: Japanese Patent Publication No. S56-138963, FIG. 1.
Patent Literature 4: Japanese Patent Publication No. S58-68968, FIG. 1.

Non Patent Literature

Non Patent Literature 1: PETER J. W. NOBLE, Self-Scanned Silicon Image Detector Arrays, April, 1968, IEEE Transaction on Electron Devices, Vol. ED-15, No. 4, pp. 206, FIG. 11

SUMMARY OF INVENTION

Technical Problem

However, in practice, few devices using an a-Si TFT or polycrystalline Si TFT for signal amplification of an image sensor have been put into practical use. The reasons are described below.

In case that an a-Si TFT is used to amplify a signal, electric potential causing the TFT to be always in conduction state continues to be applied between gate and source of the TFT. In the a-Si TFT, when voltage continues to be applied between gate and source, a threshold voltage value largely varies regardless of polarity of the voltage. Therefore, when the a-Si TFT is used for signal amplification, continuous use of an image sensor changes its characteristics, resulting in a problem in reliability such that a signal to be output also varies.

In case of a polycrystalline Si TFT, even when voltage continues to be applied between gate and source, a threshold variation therewith is far smaller than the a-Si TFT. However, in case of the polycrystalline Si TFT, an initial characteristic variation of a threshold voltage value is far larger than the a-Si TFT. This characteristic variation is a fundamental problem resulting from a variation of a crystal particle diameter of polycrystalline Si and the like, and then large difference of threshold voltage values is generated even between elements disposed in an immediate vicinity of each other. When such a variation of the threshold voltage value occurs, signals to be output also vary, which then causes a variation among respective pixels of the image sensor, resulting in occurrence of FPN (Fixed Pattern Noise).

As described above, to realize lower exposure and higher definition of the X-ray diagnostic apparatus, even when the APS technique is applied to an FPD using a TFT as a transistor, a problem of occurrence of a threshold voltage value variation of the a-Si TFT and a problem of occurrence of FPN resulting from a characteristic variation of the p-Si TFT are produced.

An objective of the present invention is to provide a signal amplifier circuit largely inhibiting a threshold variation of a thin-film semiconductor used in the signal amplifier circuit and a method for driving the circuit, and to provide an image sensor having high S/N ratio used for a radiation imaging apparatus, the image sensor including the signal amplifier circuit disposed in each pixel and being free of a problem in reliability.

Solution to Problem

To achieve the above objective, an amplifier circuit according to a first aspect of the present invention is an amplifier circuit outputting current in accordance with voltage applied to an input terminal of the circuit, wherein the amplifier circuit includes at least one transistor, a gate terminal of the transistor is connected to the input terminal, a source terminal of the transistor is connected to an output terminal of the circuit, the amplifier circuit performs an operation including an output period of outputting a signal and a stop period of outputting no signal, a controller controls potential of the source terminal of the transistor to be equal to potential of a drain terminal of the transistor in the stop period, and the potential of the drain terminal of the transistor is always higher than potential of the gate terminal thereof.

To achieve the above objective, an amplifier circuit according to a second aspect of the present invention is a circuit, wherein, in the amplifier circuit according to the first aspect of the present invention, the transistor is formed with an oxide semiconductor.

To achieve the above objective, an image sensor using an amplifier circuit according to a third aspect of the present invention is an image sensor including an amplifier circuit and a photoelectric converter in each pixel, wherein the photoelectric converter includes a photoelectric conversion device and a first transistor connected in series, a gate terminal of a second transistor constituting the amplifier circuit is connected to a junction of the photoelectric conversion device and the first transistor, a source terminal of the second transistor is connected to a reading wiring via a third transistor, the first transistor functions to reset the photoelectric conversion device at constant potential by a first control signal, the third transistor functions to output an output of the amplifier circuit to the reading wiring by a second control signal, the controller controls potential of the source terminal of the second transistor to be equal to potential of a drain terminal of the second transistor during a period other than a period of outputting the output of the amplifier circuit to the reading wiring, and then the potential of the drain terminal of the second transistor is always higher than potential of the gate terminal thereof.

To achieve the above objective, an image sensor using an amplifier circuit according to a fourth aspect of the present invention is an image sensor, wherein the controller includes a fourth transistor connected in parallel to the source terminal and the drain terminal of the second transistor, and a gate terminal of the fourth transistor is controlled by a third control signal differing from the first control signal and the second control signal.

To achieve the above objective, an image sensor using an amplifier circuit according to a fifth aspect of the present invention is an image sensor, wherein the controller includes the fourth transistor connected in parallel to the source terminal and the drain terminal of the second transistor, a fifth transistor where a drain terminal and a gate terminal thereof are connected to the first control signal and a source terminal thereof is connected to the gate terminal of the fourth transistor, and a sixth transistor where a gate terminal thereof is connected to the second control signal, a source terminal thereof is connected to a power supply, and a drain terminal thereof is connected to the gate terminal of the fourth transistor.

To achieve the above objective, an image sensor using an amplifier circuit according to a sixth aspect of the present invention is an image sensor, wherein the controller includes a seventh transistor and a first capacitor connected in series, a gate terminal of the seventh transistor is connected to the first control signal, a drain terminal thereof is connected to the drain terminal of the second transistor, and a source terminal thereof is connected to the source terminal of the second transistor.

To achieve the above objective, an image sensor using an amplifier circuit according to a seventh aspect of the present invention is an image sensor using an amplifier circuit according to any one of the third aspect to the sixth aspect of the present invention, wherein at least the second transistor is formed with an oxide semiconductor.

To achieve the above objective, an image sensor using an amplifier circuit according to an eighth aspect of the present invention is an image sensor using an amplifier circuit according to any one of the third aspect to the seventh aspect of the present invention, wherein the photoelectric conversion device includes a photodiode and a phosphor.

To achieve the above objective, an image sensor using an amplifier circuit according to a ninth aspect of the present invention is an image sensor using an amplifier circuit according to any one of the third aspect to the seventh aspect of the present invention, wherein the photoelectric conversion device includes a photoconductive layer sandwiched by two electrodes and a second capacitor connected in series to the photoconductive layer, and the drain terminal of the first transistor is connected to a junction of the photoconductive layer and the second capacitor.

Advantageous Effects of Invention

According to the present invention, an amplifier circuit using a thin-film semiconductor free of a problem in reliability is able to be realized.

Further, according to the present invention, S/N ratio of an image sensor is able to be increased without a problem in reliability.

DESCRIPTION OF EMBODIMENT

Figure 1:
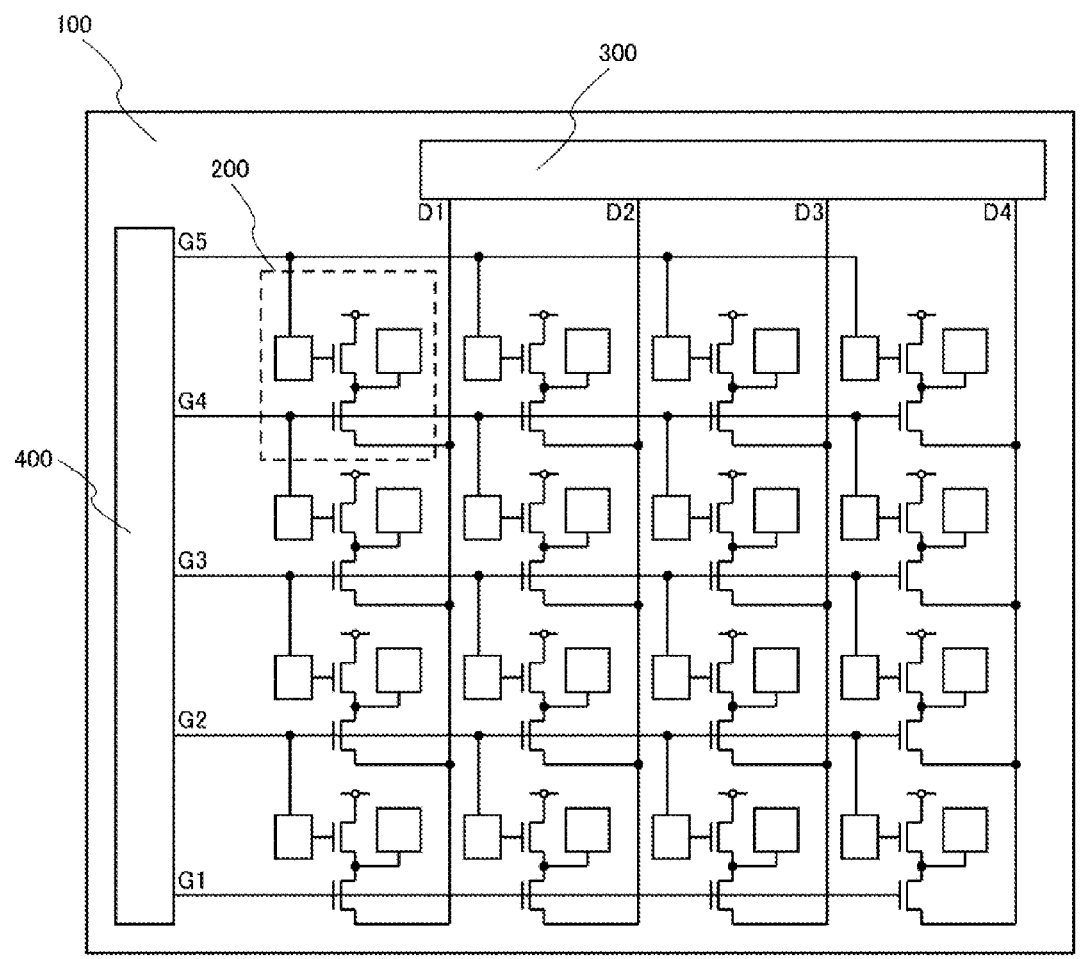
FIG. 1 is a block diagram illustrating a configuration of an image sensor of the present invention.

Embodiment of the present invention will be described in detail with reference to the drawings. Size and reduction scale of each element in each drawing are appropriately changed and described to ensure visibility of the drawing. Further, hatching applied to each drawing is to discriminate elements from each other and does not necessarily mean a cutting plane.

FIG. 1 illustrates a configuration of an image sensor according to the present invention. On a substrate 100, reading wirings D1 to D4 and scanning lines G1 to G5 are disposed vertically and horizontally. In positions divided by the reading wirings and the scanning lines, pixels 200 are disposed in a matrix manner. Each reading wiring is connected to a reading circuit 300 and each scanning line is connected to a scanning circuit 400. This figure illustrates an example in which pixels are disposed in 4×4 manner vertically and horizontally, however, needless to say, the number of pixels is variable as necessary. It is noted that the number of scanning lines needs to be larger than the horizontal number of pixels by at least 1.

Figure 2:
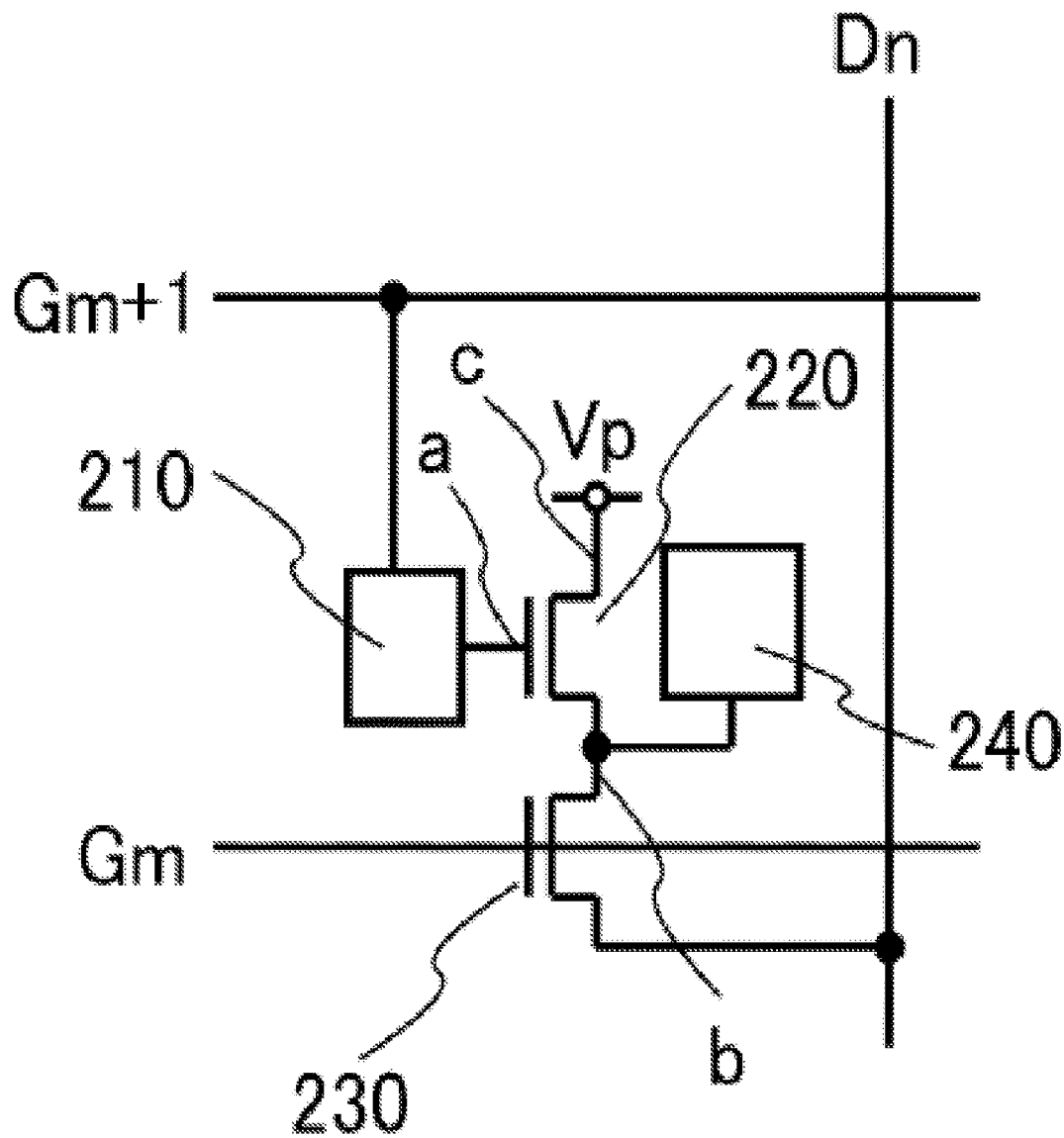
FIG. 2 is a block diagram illustrating a configuration of a pixel of the image sensor of the present invention.

FIG. 2 is a circuit diagram illustrating elements of a pixel. Each pixel includes a photoelectric converter 210, an amplifying transistor 220 connected to the photoelectric converter 210, a reading transistor 230 controlling an output of the amplifying transistor 220, and a controller 240 controlling source potential of the amplifying transistor 220. As the photoelectric converter, any one of an indirect conversion type and a direct conversion type is usable.

Figure 3:
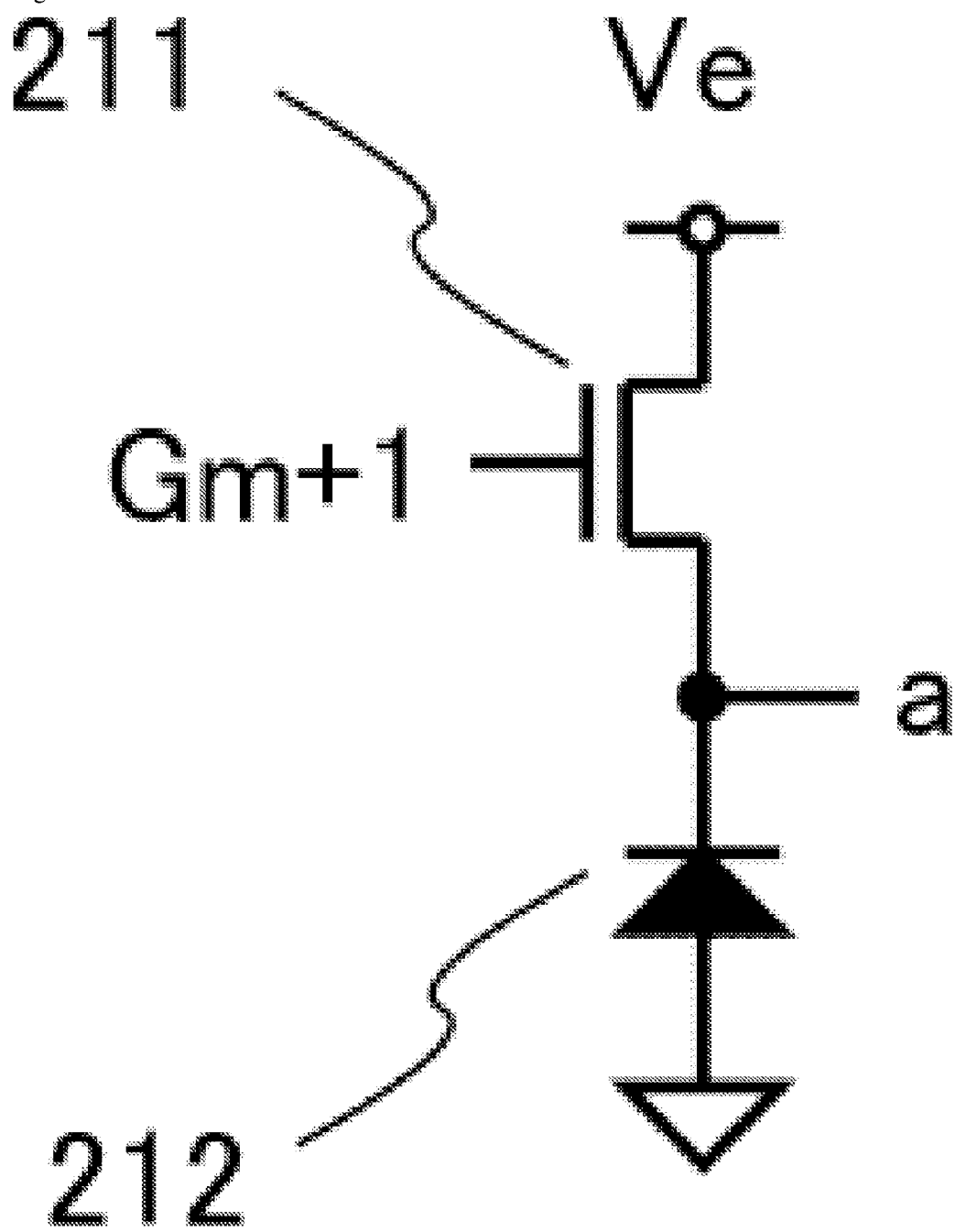
FIG. 3 is a circuit diagram illustrating a configuration of a photoelectric converter of the image sensor of the present invention.

FIG. 3 illustrates one configurational example where an indirect conversion type is used as the photoelectric converter. This photoelectric converter includes a photodiode 212, a resetting transistor 211, and a phosphor that is not illustrated. A gate terminal of the resetting transistor 211 is connected to Gm+1 that is one of the scanning lines, and a node a that is a junction of the photodiode 212 and the resetting transistor 211 is connected to the amplifying transistor 220. Further, a drain terminal of the resetting transistor 211 is connected to a bias power supply Ve.

Figure 4:
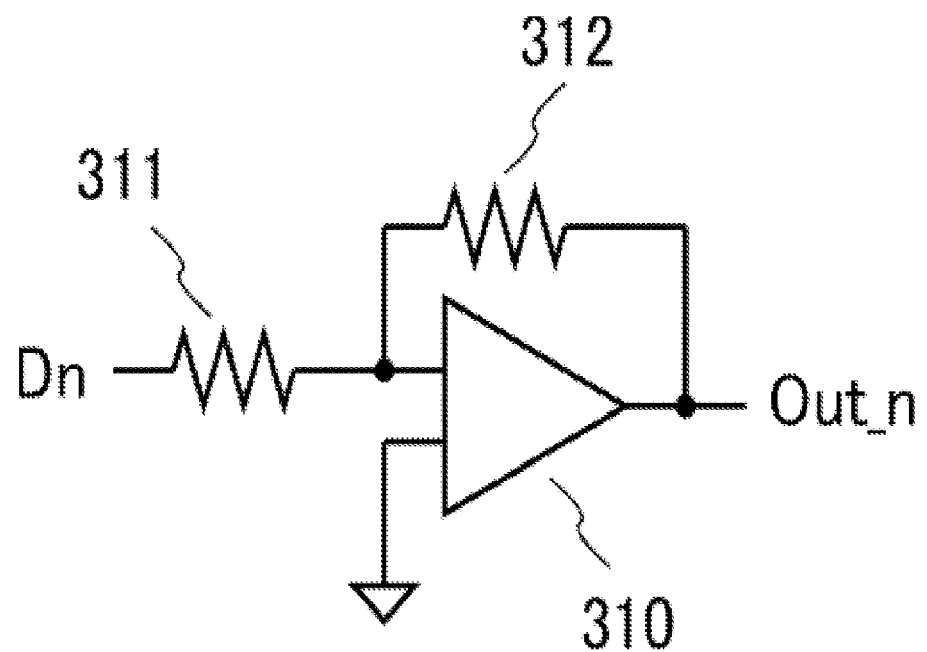
FIG. 4 is a circuit diagram illustrating a unit circuit of a reading circuit of the present invention.

It is possible to configure the reading circuit 300 by arranging a voltage amplifier circuit or a current-voltage conversion circuit at a number that is at least the number of reading wirings. FIG. 4 illustrates a unit circuit where the reading circuit 300 includes a voltage amplifier circuit. This circuit has a configuration where a resistance 311 is connected as an input resistance of an operational amplifier 310 and a resistance 312 is connected as a negative feedback resistance.

The scanning circuit 400 is a circuit for outputting pulses sequentially driving the scanning lines, and for example, a circuit having the same configuration as a gate driver circuit of a liquid crystal display device is usable.

The reading circuit and the scanning circuit may be formed on an image sensor substrate, and are COG (Chip-On-Glass)-connectable on a substrate or connectable via a cable.

The aforementioned transistor is formed with an oxide thin-film semiconductor. When the indirect conversion type is used as the photoelectric converter, an a-Si:H (hydrogenated amorphous silicon) thin film is usable as the photodiode. A laminated structure of p-i-n type is specifically preferable in view of performance.

Figure 5:
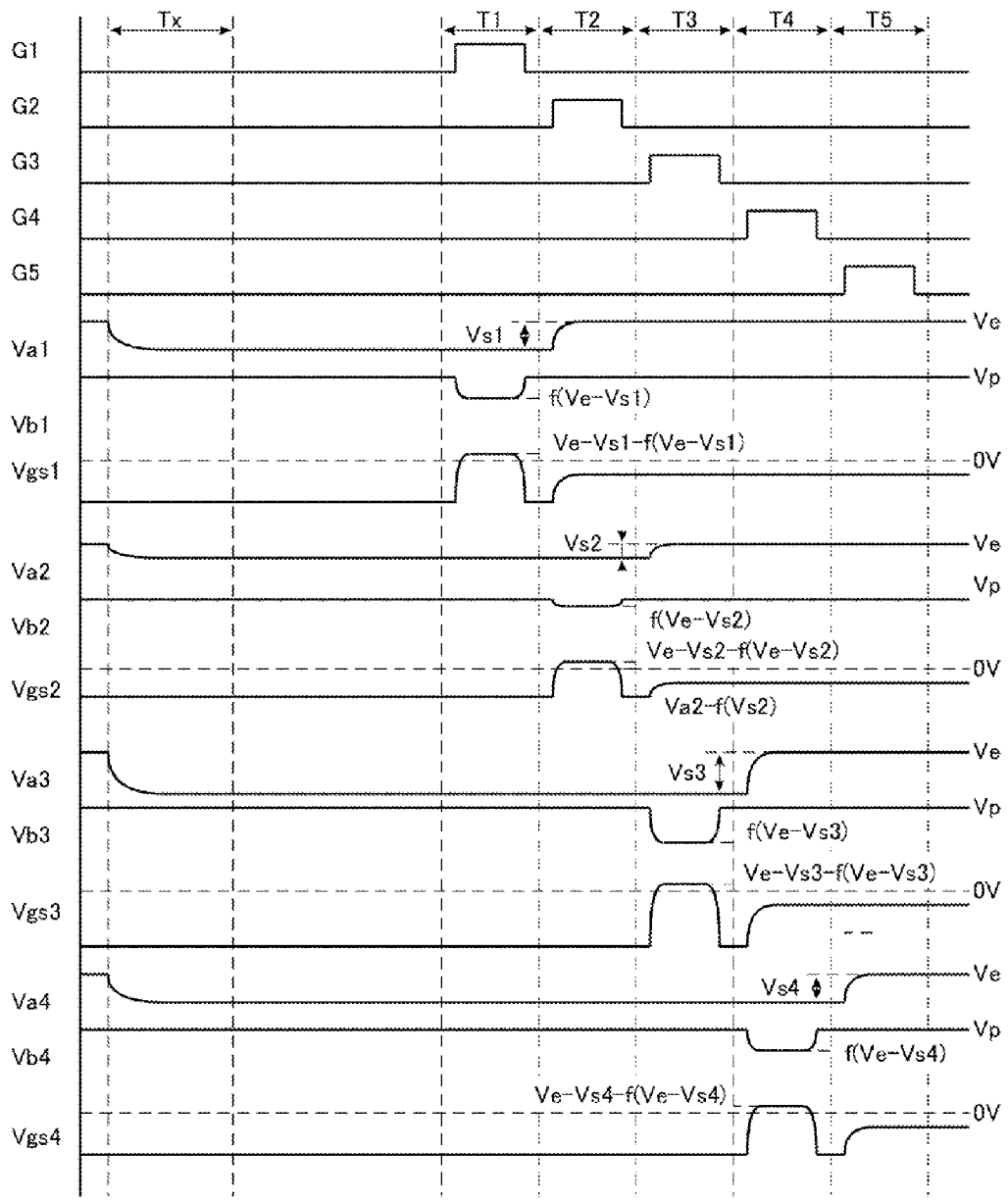
FIG. 5 is a timing chart illustrating operations of the image sensor of the present invention.

Next, operations are described with reference to a timing chart of FIG. 5. This chart illustrates operations during a period of reading signals of all pixels of the image sensor of the present invention including 4×4 pixels. In this figure, Va1 to Va4 represent potential of the nodes a in pixels on different lines and Vb1 to Vb4 represent potential of the nodes b in pixels on different lines. Further, Vgs1 to Vgs4 represent source-gate voltage of the amplifying transistors 220 in pixels on different lines.

During a period Tx, X-rays are emitted and then X-rays transmitted through a subject to be examined is irradiated to the image sensor. When the indirect conversion type is used as the photoelectric converter, X-rays irradiated to the image sensor excite a phosphor to emit light. The light emitted from the phosphor is irradiated to the photodiode 212 and then a pair of a hole and an electron is generated in the photodiode 212. Since the photodiode 212 is reversely biased to Ve and the resetting transistor 211 is in non-conduction state, the hole and the electron travel in opposite directions by each inner electric field to decrease charge accumulated in the photodiode 212. Therefore, voltage of the node a varies. When this charge variation amount is designated as ΔQ, voltage change amount Vs of the node a is expressed as follows.

$$Vs = \Delta Q / Cd \qquad (1)$$

where Cd is capacitance of the photodiode.

During a period T1, a pulse causing the reading transistor 230 to be in conduction state is applied to a scanning line G1. Thereby, in all pixels where the reading transistor 230 is connected to the scanning line G1, the reading transistor 230 becomes in conduction state. During this period, the controller 240 stops an operation for holding source (node b) potential of the amplifying transistor 220 at the same potential as drain (node c) potential. Then, current in accordance with the potential of the node a of the photoelectric converter flows between source and drain of the amplifying transistor 220. This current flows to a reading wiring via the reading transistor 230 to be input to the reading circuit. As this reading circuit, a circuit having the configuration illustrated in FIG. 4 is used, and when the resistance 311 is set at a sufficiently large resistance value, the amplifying transistor 220 functions as a source follower circuit, and thereby potential Vb of the source (node b) of the amplifying transistor 220 indicates voltage approximated by the following expression.

$$Vb = Ve - Vs - Vth \tag{2}$$

where Vth is a threshold voltage value of the amplifying transistor 220.

This voltage Vb is amplified by the reading circuit to be output. Output voltage of a detection circuit is determined by a value R1 of the input resistance 311 and a resistance value R2 of the feedback resistance 312 as follows.

$$Vout = -R2/R1 \times Vb \tag{3}$$

where, since Vb is a function of the voltage Vs dependent on irradiation intensity of X-rays, output voltage Vout makes it possible to measure the irradiation intensity of X-rays.

During a period T2, potential of the scanning line G1 is changed to potential causing the reading transistor 230 to be in non-conduction state and then a pulse causing the reading transistor 230 to be in conduction state is applied to a scanning line G2. Thereby, in all pixels where the reading transistor 230 is connected to the scanning line G1, the reading transistor 230 becomes in non-conduction state, and then the controller 240 causes the source (node b) and the drain (node c) of the amplifying transistor 220 to have the same potential. Then, the resetting transistor 211 of the photoelectric converter becomes in conduction state.

The drain terminal of the resetting transistor 211 is being applied with voltage Ve for biasing the photodiode 212, and when the resetting transistor 211 becomes in conduction state, the photodiode 212 is reversely biased. In the example described here, since a cathode terminal of the photodiode 212 is set at GND level, Ve is assumed to be positive voltage.

Further, during this period T2, in all pixels where the reading transistor 230 is connected to the scanning line G2, the source (node b) voltage of the amplifying transistor 220 dependent on potential of the node a is output to a reading wiring via the reading transistor 230 and amplified by the reading circuit to be output.

Through these operations performed for all the scanning lines, signals of all the pixels of the image sensor are read, and then the photodiode is reset at predetermined voltage Ve.

Since potential of the node a varies from GND up to Ve, voltage Vp applied to the drain terminal of the amplifying transistor 220 is set to be at least voltage of Ve added by a threshold voltage value Vth of the transistor.

According to the present invention, S/N ratio of the image sensor is able to be increased without a problem in reliability. The reason is described below.

Initially, the reason why high S/N ratio is able to be realized is described. In a conventional FPD, a signal of a photoelectric converter is transferred to a reading circuit in form of electric charge. On the other hand, signal charge to be detected is small to an extent of several pC, and accuracy needed for a detection circuit is at most 1 pC. Further, since an outer shape of the FPD is far larger than a common CCD sensor and a CMOS sensor, a reading wiring for transferring signal charge increases in length, resulting in being susceptible to noise influence. Further, in the image sensor, the reading wiring has many intersections with other wirings, and via capacitor coupling formed in these intersections, noise is mixed. A length of the reading wiring is substantially equal to the outer shape of the image sensor, resulting in being also susceptible to disturbance noise as seen in an antenna. Therefore, it has been difficult to increase S/N ratio of an image sensor reading a signal as electric charge similarly to the conventional FPD.

On the other hand, in the present invention, signal charge is current-amplified by an amplifying transistor and detected as voltage in a reading circuit. In other words, the amplifying transistor is able to lower an output impedance, resulting in noise resistance. As a result, high S/N ratio is able to be realized.

Next, the reason why a problem in reliability is able to be avoided is described below. When the amplifying transistor 220 as illustrated in FIG. 2 is disposed in a pixel, generally, voltage of positive polarity continues to be applied between source and gate of the amplifying transistor. The reason is that source potential becomes lower by a threshold value than gate potential. Even when in the reading transistor 230, the source of the amplifying transistor 220 is cut off from a reading wiring or the reading circuit 300 functioning as a load, leakage of the reading transistor 230 causes source potential of the amplifying transistor 220 to be lower than gate potential thereof, and then voltage of positive polarity is applied between the source and the gate.

Figure 6:
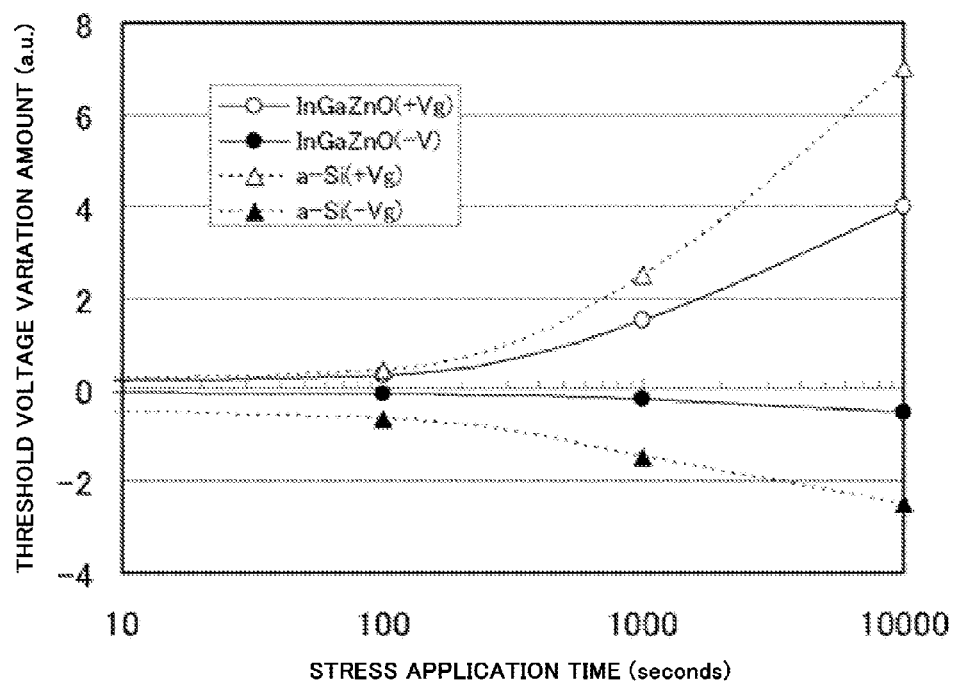
FIG. 6 is a graph illustrating gate stress test results of an a-Si transistor and an oxide semiconductor transistor.

FIG. 6 illustrates results of threshold variation measurement where gate bias is applied to an a-Si transistor and an oxide semiconductor transistor. As material of the oxide semiconductor, In—Ga—Zn—O is used. The results confirm that when positive bias continues to be applied between source and gate, threshold values of both the a-Si transistor and the oxide semiconductor transistor vary. Therefore, in a pixel of a conventional APS configuration, threshold voltage of the amplifying transistor 220 varies. On the other hand, when negative bias is applied between source and gate, the present inventors have found out that threshold voltage of the a-Si transistor varies but threshold voltage of the oxide semiconductor transistor does not substantially vary.

In the image sensor according to the present invention, a transistor is formed with an oxide semiconductor. The controller 240 controls source potential of the amplifying transistor 220 of a pixel to be equal to drain potential thereof during a period other than a period when the reading transistor 230 is conductive. A maximum value of the gate potential is Ve and the drain potential is Vp, and since Vp is set to be higher than Ve, potential between source and gate has negative polarity during a period other than a period when the reading transistor 230 is conductive. In other words, as illustrated in FIG. 5, voltage values between source and gate Vgs1 to Vgs4 of the amplifying transistor 220 become always negative during a period except a period when the reading transistor 230 is conductive, that is a period of reading signals. Therefore, the threshold voltage does not substantially vary. Accordingly, a problem in reliability is able to be largely avoided.

Figure 7:
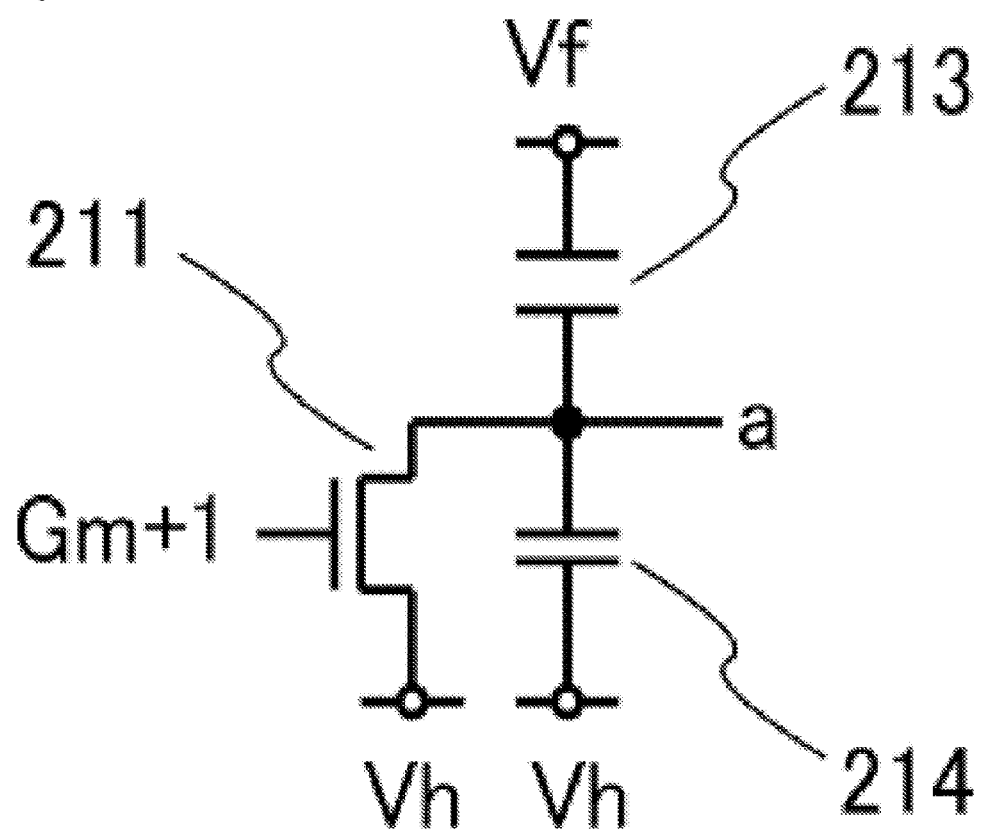
FIG. 7 is a circuit diagram illustrating a configuration of the photoelectric converter of the image sensor of the present invention.

In the above description, an example using the indirect conversion type as the photoelectric converter has been represented, however, use of the direct conversion type produces the same effect. FIG. 7 illustrates one configurational example where the direct conversion type is used as the photoelectric converter. This photoelectric converter includes a photoconductive layer 213, a resetting transistor 211, and a capacitor 214. A gate terminal of the resetting transistor 211 is connected to Gm+1, one of the scanning lines, and a node a where one terminal of the photoconductive layer 213, one terminal of the capacitor 214, and a drain of the resetting transistor 211 are connected together is connected to the gate of the amplifying transistor 220. Further, the other terminal of the photoconductive layer 213 is connected to a bias power supply Vf, and the other terminal of the capacitor 214 and a source terminal of the resetting transistor 211 are connected to a power supply Vh. As this photoconductive layer 213, one having a structure where a thick film obtained by laminating CdS or the like at several hundred μm or more is sandwiched by electrodes is usable.

When X-rays are irradiated to the photoelectric converter, the X-rays are absorbed in the photoconductive layer 213 to generate a pair of a hole and an electron. Since the photoconductive layer 213 is being applied with voltage Vf−Vh and the resetting transistor 211 is non-conductive, the hole and the electron generated in the photoconductive layer 213 travel within the photoconductive layer 213 by each inner electric field and cause electric charge held in the electrodes to decrease.

As an operation method, the same method as in the indirect conversion type is usable. Initially, the resetting transistor 211 resets charge of the capacitor 214 by charging the node a at potential of Vh. Thereafter, when X-rays are irradiated, a pair of a hole and an electron generated in the photoconductive layer 213 causes charge held in both ends of the photoconductive layer 213 to decrease. Therewith, potential of the node a varies. This variation value of Va is expressed as follows.

$$Va = Vh - \Delta Q/(Cp+Cs) \quad (4)$$

where ΔQ is a charge amount decreased by X-ray irradiation, and Cp and Cs are a capacitance of the photoconductive layer 213 and a capacitance of the capacitor 214, respectively. Therefore, drain voltage Vp of the amplifying transistor 220 is set as follows based on a predicted maximum value of ΔQmax. Vth is a threshold voltage value of the amplifying transistor 220.

$$Vp > Vh - \Delta Qmax/(Cp+Cs) + Vth \quad (5)$$

According to the above configuration and operation method, during a period when the reading transistor 230 is conductive, when this potential of the node a is current-amplified by the amplifying transistor 220 and read, signal voltage in accordance with irradiation intensity of X-rays becomes obtainable.

The essential points of the present invention are that a configuration where an amplifying transistor is disposed in each pixel of an image sensor is used and the transistor is formed with an oxide semiconductor, and that, in substantially all the period when no signal is output from the amplifying transistor, a source terminal and a drain terminal of the amplifying transistor are set to have the same potential. Thereby, the aforementioned effect becomes obtainable.

First Example

Figure 8:
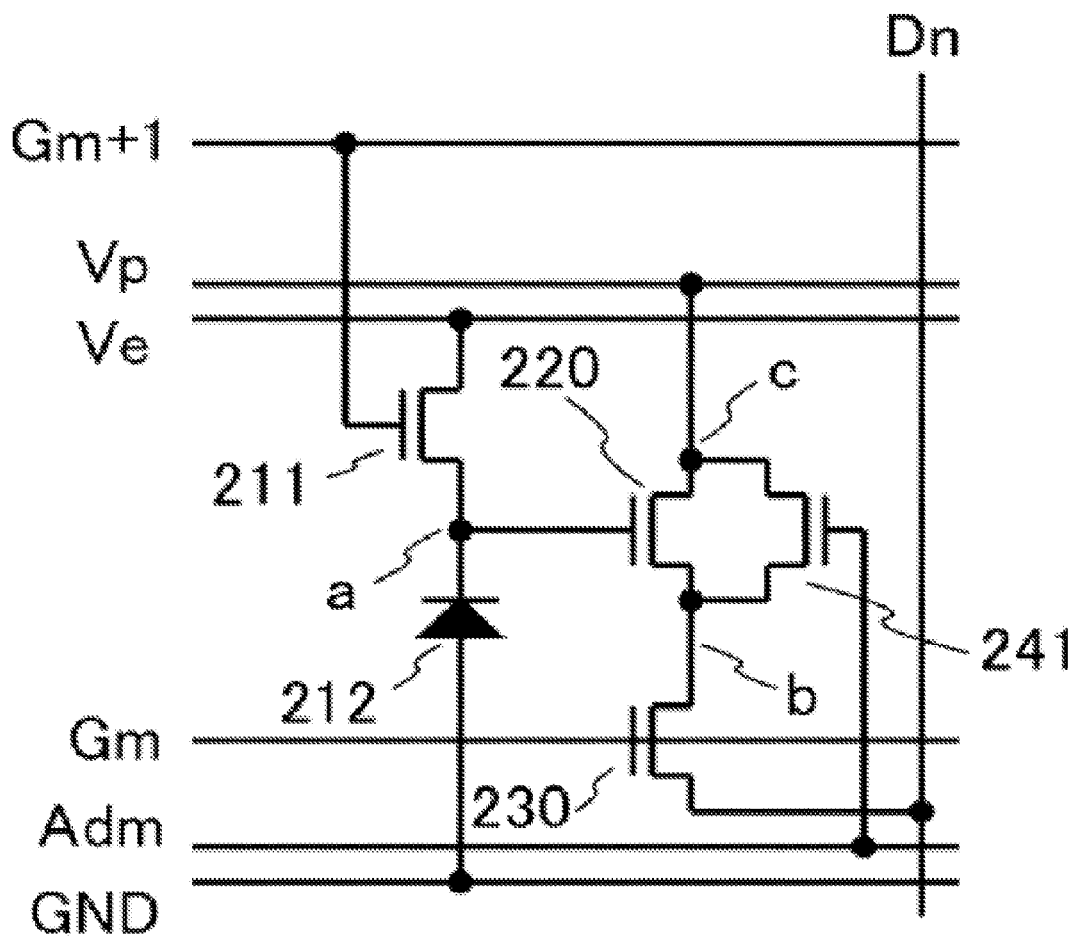
FIG. 8 is a circuit diagram illustrating a configuration of the pixel of the image sensor of the present invention.

FIG. 8 illustrates a configuration of a pixel unit in an image sensor according to a first example of the present invention. This figure illustrates in detail a configuration of a controller using the indirect conversion type as a photoelectric converter. A configuration other than the controller is the same as the configuration illustrated as the embodiment of the present invention. As a transistor, an oxide semiconductor is used.

The controller according to this example has a configuration where a transistor 241 is disposed in parallel with a source terminal and a drain terminal of an amplifying transistor 220. A gate terminal of the transistor 241 is connected to a control line Adm.

Figure 9:
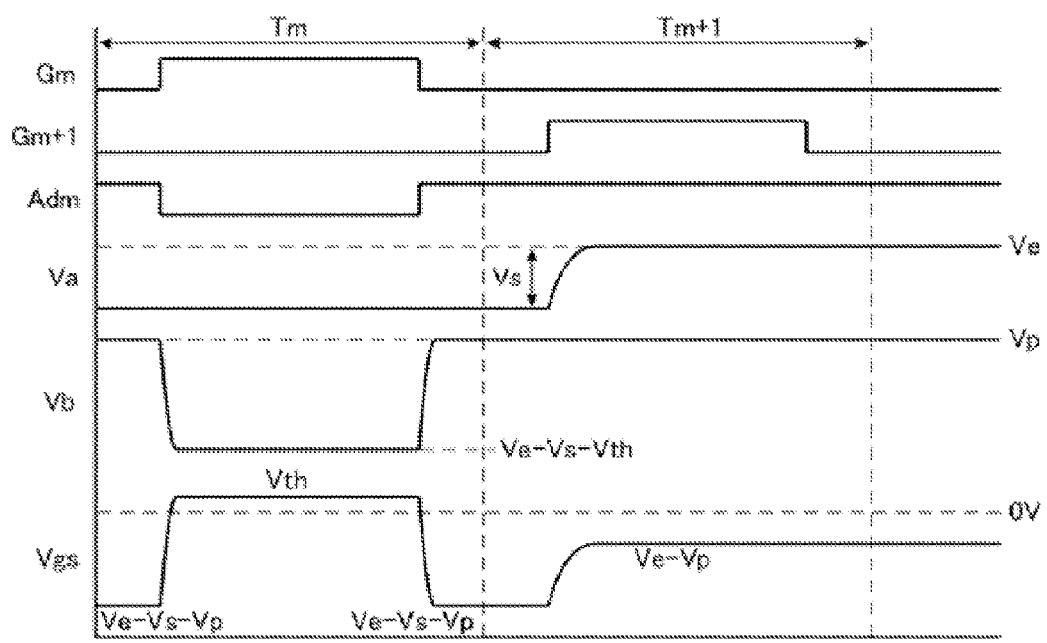
FIG. 9 is a timing chart illustrating operations of the image sensor of the present invention.

FIG. 9 is a timing chart illustrating operations. Although being not illustrated, it is assumed that X-rays have been irradiated to the image sensor prior to a period Tm, charge has been generated in a pixel in accordance with X-ray irradiation intensity, and voltage of a node a connected with a cathode terminal of a photodiode 212 has been decreased from Ve by Vs. During the period Tm, a pulse causing a transistor to be in conduction state is applied to a scanning line Gm and then a reading transistor 230 becomes in conduction state. Potential causing a transistor to be in non-conduction state is applied to the control line Adm and then the transistor 241 becomes in non-conduction state. Then, current in accordance with the voltage of the node a flows between source and drain of the amplifying transistor 220, being input to the reading circuit 300 via the reading transistor 230 and a reading wiring Dn, and then a signal is read.

During a period Tm+1, a pulse causing a transistor to be in conduction state is applied to a scanning line Gm+1 and a resetting transistor 211 becomes in conduction state, and thereby the photodiode 212 is reversely biased to Ve. Further, potential of the scanning line Gm is potential causing a transistor to be in non-conduction state and the reading transistor 230 becomes in non-conduction state. Since potential of the control line Adm continues to be applied as potential causing a transistor to be in conduction state during a period other than the period Tm, the transistor 241 becomes in conduction state. Then, the transistor 241 causes source potential of the amplifying transistor 220 to become equal to drain potential thereof that is Vp. Therefore, voltage between source and gate of the amplifying transistor 220 becomes always voltage of negative polarity during a period other than a period of reading signals.

In the image sensor according to the first example, S/N ratio of the image sensor is able to be increased without a problem in reliability.

The reason why the S/N ratio is increased is the same as the reason described in the image sensor according to the embodiment of the present invention.

The reason why no problem in reliability is produced is that the amplifying transistor 220 is formed with an oxide semiconductor and further the transistor 241 holds voltage of the source terminal of the amplifying transistor 220 at the same level as voltage of the drain terminal thereof during a period other than a period of reading signals, resulting in causing voltage between source and gate to be voltage of negative polarity. Therefore, by the same reason as the reason described in the image sensor according to the embodiment of the present invention, no problem in reliability is produced.

Second Example

Figure 10:
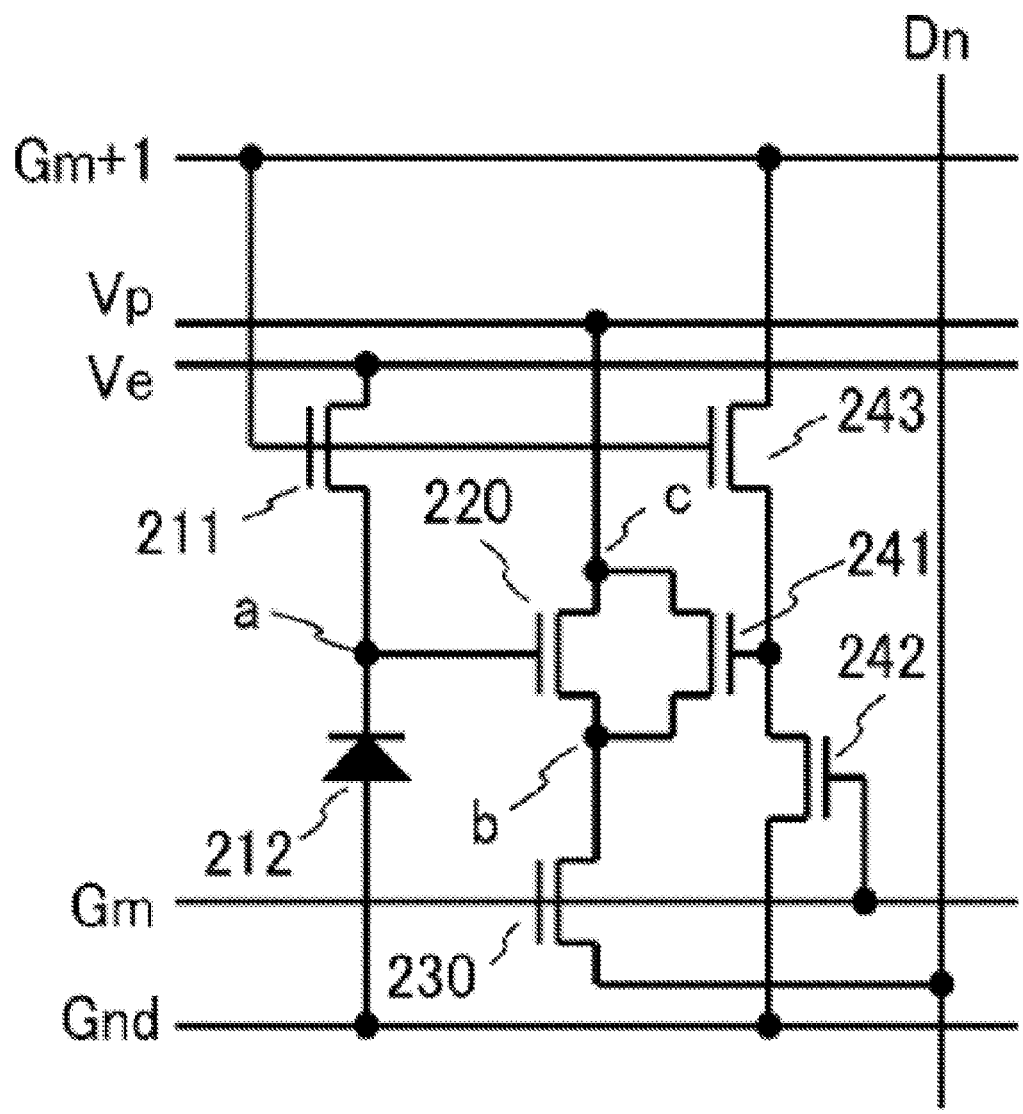
FIG. 10 is a circuit diagram illustrating a configuration of the pixel of the image sensor of the present invention.

FIG. 10 illustrates a configuration of a pixel unit in an image sensor according to a second example of the present invention. This figure illustrates in detail a configuration of a controller using the indirect conversion type as a photoelectric converter. A configuration other than the controller is the same as the configuration illustrated as the embodiment of the present invention. As a transistor, an oxide semiconductor is used.

The controller according to this example has a configuration where a transistor 241 is disposed in parallel with a source terminal and a drain terminal of an amplifying transistor 220. A gate terminal of the transistor 241 is connected to a source terminal of a transistor 243 whose drain terminal is connected to a scanning line Gm+1, and to a drain terminal of a transistor 242 whose source terminal is connected to GND. A gate terminal of the transistor 243 is connected to the scanning line Gm+1 and a gate terminal of the transistor 242 is connected to a scanning line Gm. Although being not illustrated here, the gate terminal of the transistor 241 may be connected with a capacitor where one terminal thereof is connected to constant potential.

Figure 11:
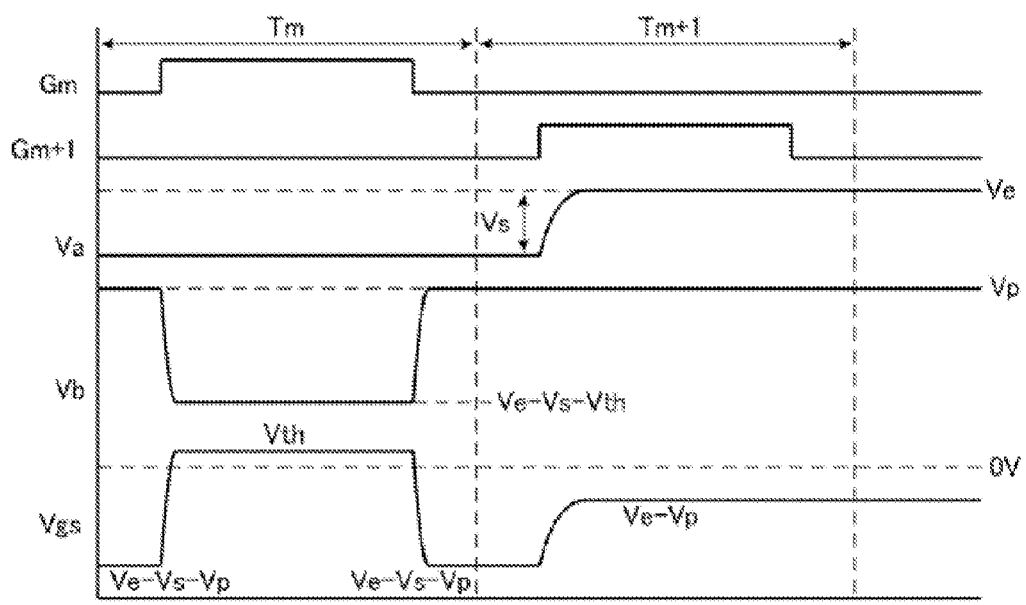
FIG. 11 is a timing chart illustrating operations of the image sensor of the present invention.

FIG. 11 is a timing chart illustrating operations. Although being not illustrated, it is assumed that X-rays have been irradiated to the image sensor prior to a period Tm, charge has been generated in a pixel in accordance with X-ray irradiation intensity, and voltage of a node a connected with a cathode terminal of a photodiode 212 has been decreased from Ve by Vs. During the period Tm, a pulse causing a transistor to be in conduction state is applied to the scanning line Gm and then a reading transistor 230 becomes in conduction state. At the same time, the transistor 242 of the controller also becomes in conduction state. Since the scanning line Gm+1 has potential causing a transistor to be in non-conduction state, the transistor 243 is in non-conduction state. Therefore, gate potential of the transistor 241 becomes at GND level and then the transistor 241 becomes in non-conduction state. Then, current in accordance with voltage of the node a flows between source and drain of the amplifying transistor 220, being input to the reading circuit 300 via the reading transistor 230 and a reading wiring Dn, and then a signal is read.

During a period Tm+1, a pulse causing a transistor to be in conduction state is applied to the scanning line Gm+1 and a resetting transistor 211 becomes in conduction state, and thereby the photodiode 212 is reversely biased to Ve. At the same time, the transistor 243 also becomes in conduction state. Potential of the scanning line Gm is potential causing a transistor to be in non-conduction state, and then the reading transistor 230 becomes in non-conduction state. At the same time, the transistor 242 becomes in non-conduction state. Therefore, gate potential of the transistor 241 becomes smaller than voltage applied to the scanning line Gm+1 by a threshold voltage value of the transistor 243. When wave height of a pulse applied to the scanning line Gm+1 during this period is set to be larger than voltage Vp by at least the threshold voltage value of the transistor 243, the transistor 243 becomes in conduction state. Thereby, source potential of the amplifying transistor 220 becomes equal to drain voltage thereof that is Vp. Since the scanning lines Gm and Gm+1 are held at potential causing a transistor to be in non-conduction state until the following reading operation, gate potential of the transistor 241 is held at potential causing the transistor 241 to be in conduction state. In case that leakage current of the transistors 242 and 243 is not negligible, a capacitor may be connected to the transistor 241.

In this operation, voltage between source and gate of the amplifying transistor 220 becomes always voltage of negative polarity during a period other than a period of reading signals.

In the image sensor according to the second example, S/N ratio of the image sensor is able to be increased without a problem in reliability.

The reason is the same as the reason described in the first example.

Further, in the image sensor according to the second example, a light-receiving area of the photodiode 212 is able to be increased.

The reason is that when wirings and transistors are laid out on a substrate, an area of the wirings is commonly larger. This fact is apparent from a viewpoint of laying out the wirings so as to connect pixels adjacent to each other vertically and horizontally. In the second example, the number of transistors to be included in a pixel increases but the number of wirings decreases. Therefore, a light-receiving area of the photodiode is able to be increased. Accordingly, the S/N ratio may be further increased.

Third Example

Figure 12:
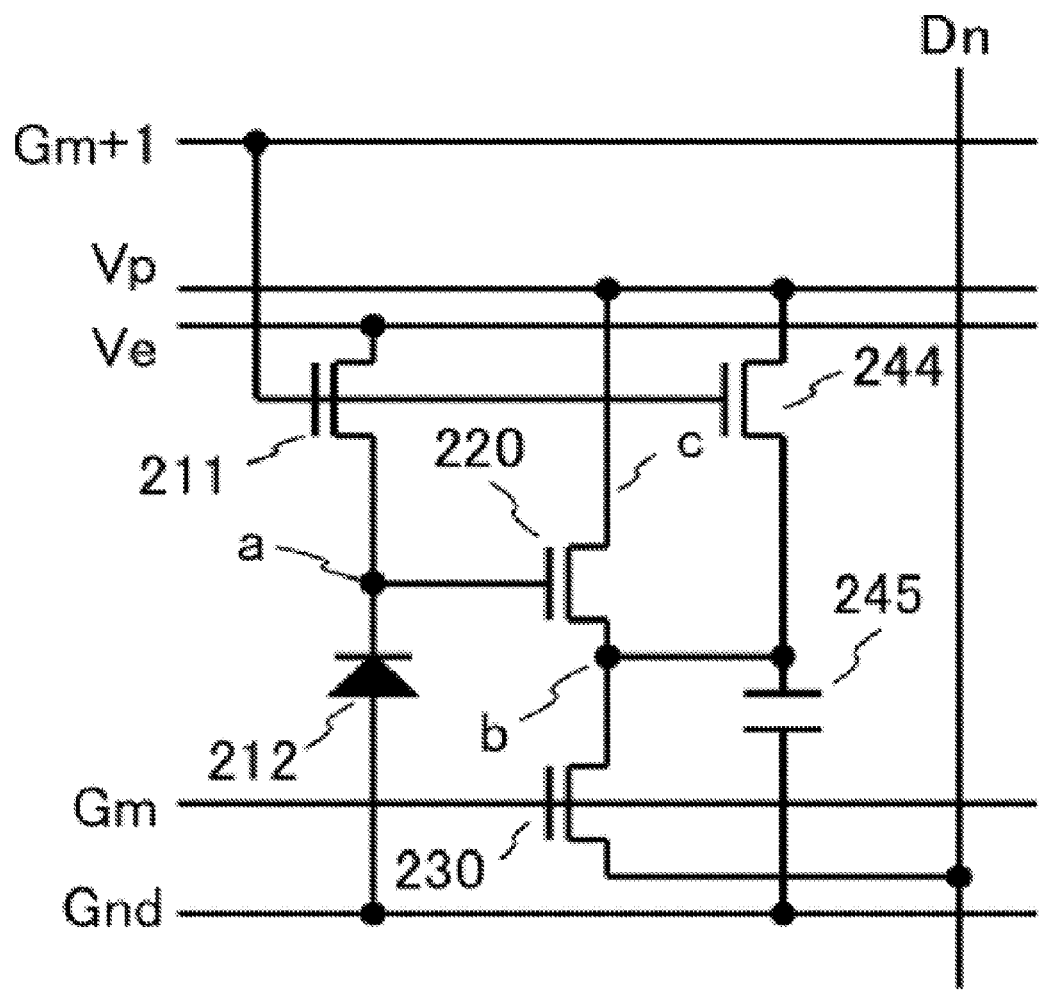
FIG. 12 is a circuit diagram illustrating a configuration of the pixel of the image sensor of the present invention.

FIG. 12 illustrates a configuration of a pixel unit in an image sensor according to a third example of the present invention. This figure illustrates in detail a configuration of a controller using the indirect conversion type as a photoelectric converter. A configuration other than the controller is the same as the configuration illustrated as the embodiment of the present invention. As a transistor, an oxide semiconductor is used.

The controller according to this example includes a transistor 244 where a source terminal thereof is connected to a source terminal of an amplifying transistor 220 and a drain terminal of the transistor 244 is connected to a power supply Vp, and a capacitor 245 where one terminal thereof is connected to the source terminal of the amplifying transistor 220 and the other terminal of the capacitor 245 is connected to GND wiring. A gate terminal of the transistor 244 is connected to a scanning line Gm+1.

Figure 13:
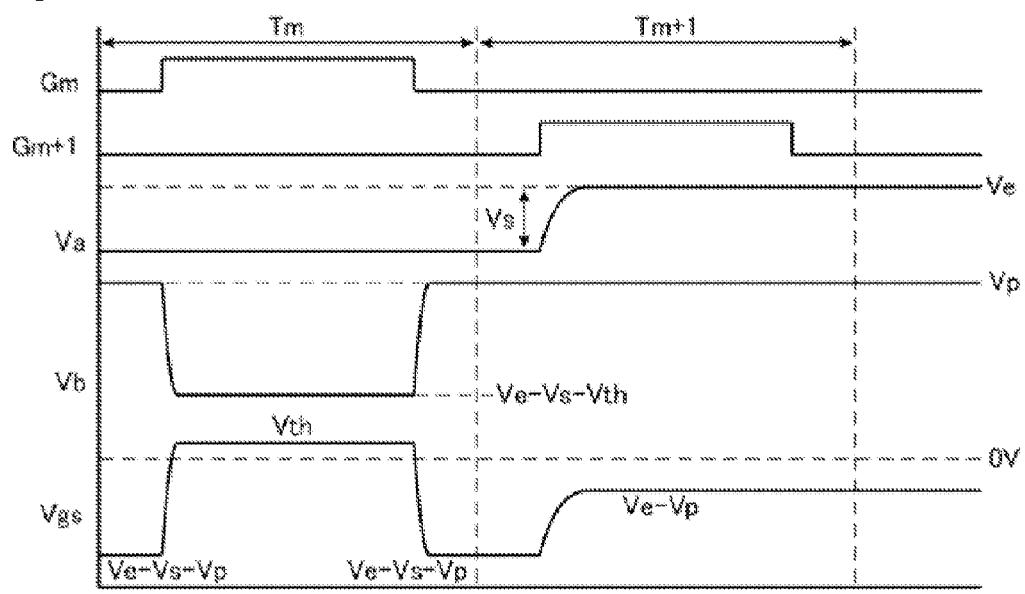
FIG. 13 is a timing chart illustrating operations of the image sensor of the present invention.

FIG. 13 is a timing chart illustrating operations. Although being not illustrated, it is assumed that X-rays have been irradiated to the image sensor prior to a period Tm, charge has been generated in a pixel in accordance with X-ray irradiation intensity, and voltage of a node a connected with a cathode terminal of a photodiode 212 has been decreased from Ve by Vs. During the period Tm, a pulse causing a transistor to be in conduction state is applied to a scanning line Gm, and then a reading transistor 230 becomes in conduction state. Thereby, current in accordance with voltage of a node a flows between source and drain of the amplifying transistor 220, being input to the reading circuit 300 via the reading transistor 230 and a reading wiring Dn, and then a signal is read.

During a period Tm+1, a pulse causing a transistor to be in conduction state is applied to the scanning line Gm+1 and then a resetting transistor 211 becomes in conduction state, and thereby the photodiode 212 is reversely biased to Ve. At the same time, the transistor 244 also becomes in conduction state. Thereby, voltage Vp is entered in the capacitor 245. When a capacitance of the capacitor 245 is set at a value to the extent that voltage variation is negligible even when leakage charge determined by a product of leakage current of the transistor 230 and a reading cycle is generated, source potential of the amplifying transistor 220 is held substantially at potential of Vp.

In this operation, voltage between source and gate of the amplifying transistor 220 becomes always voltage of negative polarity during a period other than a period of reading signals.

In the image sensor according to the third example, S/N ratio of the image sensor is able to be increased without a problem in reliability.

The reason is the same as the reason described in the first example.

Further, in the image sensor according to the third example, a light-receiving area of the photodiode 212 is able to be increased.

The reason is that the number of transistors constituting the controller is equal to that in the first example, and the number of wirings is smaller than in the first example. Therefore, the S/N ratio may be further increased.

The image sensor of the present invention described above may be produced as follows.

Figure 14:
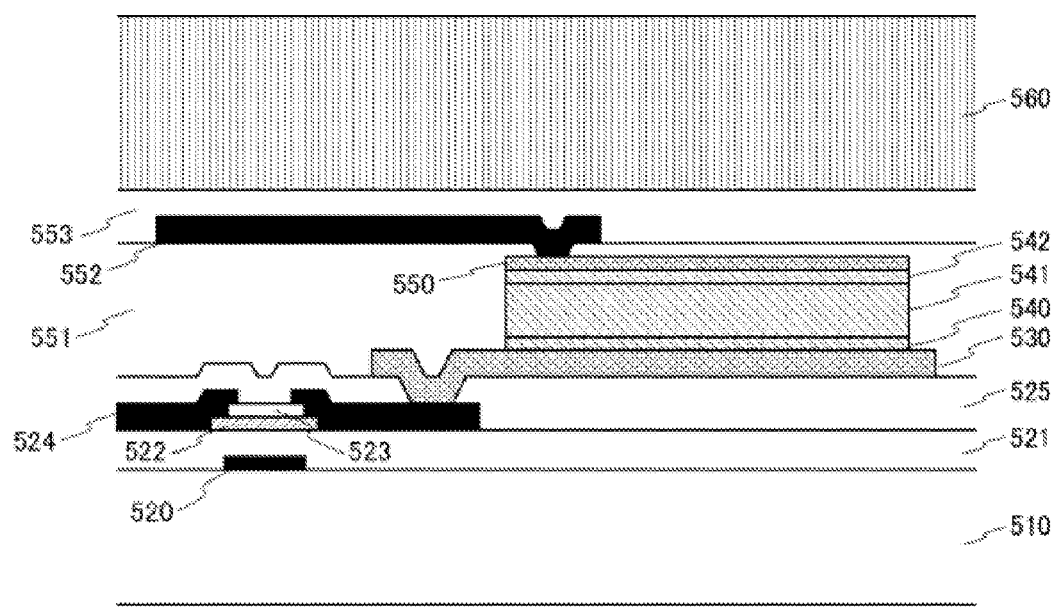
FIG. 14 is a cross-sectional view illustrating a device structure of the image sensor of the present invention.

FIG. 14 illustrates a device structure where the indirect conversion type is used as a photoelectric converter in the image sensor of the present invention.

A gate metal 520 is laminated on a substrate 510, followed by patterning. As the substrate 510, a glass substrate or the like is usable. As the gate metal 520, Al alloy or the like is usable. Then, a gate insulating film 521 is formed. As the gate insulating film 521, $SiO_2$, a laminated film of $SiO_2$ and SiN, or the like is usable, however, it is desirable that an interface between the insulating film and an oxide semiconductor to be laminated next is formed with SiO$_2$. Thereafter, an oxide semiconductor layer 522 is laminated, followed by patterning. As the oxide semiconductor layer 522, In—Ga—Zn—O or the like is usable. Then, SiO$_2$ to serve as a channel protective film 523 is laminated as a film, followed by patterning, and a source and drain metal 524 is laminated, followed by patterning. As the source and drain metal 524, Mo, Ti, a laminated film thereof, or the like is used in view of ohmic properties with respect to the oxide semiconductor. Then, an interlayer film 525 is laminated. As the interlayer film 525, SiO$_2$, a laminated film of SiO$_2$ and SiN, or the like is usable. A process for forming a transistor includes steps up to here.

Subsequently, a photodiode is formed. On the interlayer film 525, a lower electrode 530 of a photodiode is laminated, followed by patterning. As the lower electrode 530, Cr, Al alloy, or the like is usable. Thereon, n+a-Si (540), i–a-Si (541), and p+a-Si (542) are successively laminated as films to form a transparent metal film to serve as an upper electrode 550. As the transparent metal film, ITO or the like is usable. These are patterned and then a planarizing film 551 is laminated. As the planarizing film 551, acrylic resin or the like is usable. Thereon, a metal film to serve as a bias wiring 552 is formed, followed by patterning. As the bias wiring 552, Al alloy or the like is usable. Thereon, a protective film 553 is formed and thereon, a phosphor 560 is laminated. As the protective film 553, acrylic resin or the like is usable, and as the phosphor 560, CsI columnar crystal or the like is usable.

Contact holes for electrically connecting various metal films are formed in the gate insulating film 521, the interlayer film 525, the planarizing film 551, and the protective film 553, as necessary.

Figure 15:
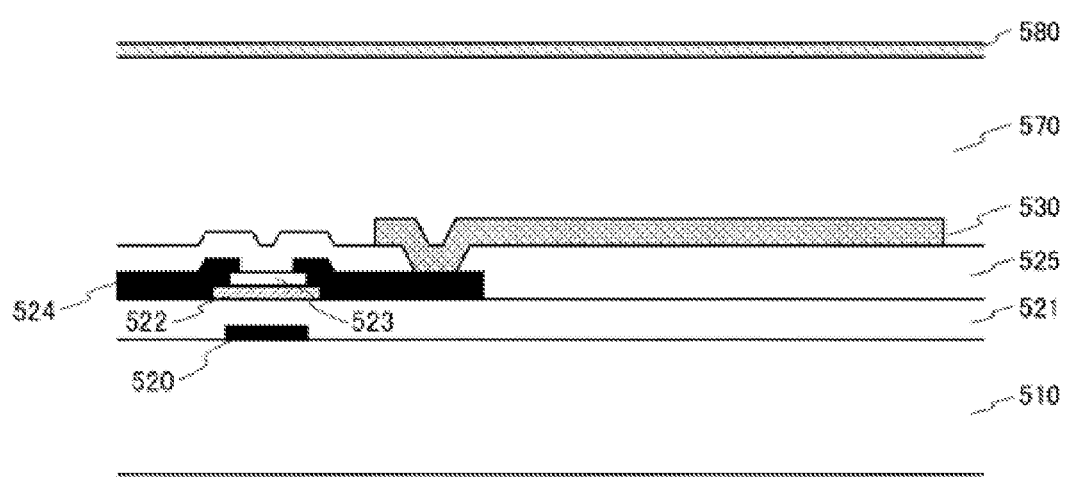
FIG. 15 is a cross-sectional view illustrating a device structure of the image sensor of the present invention.
Figure 16:
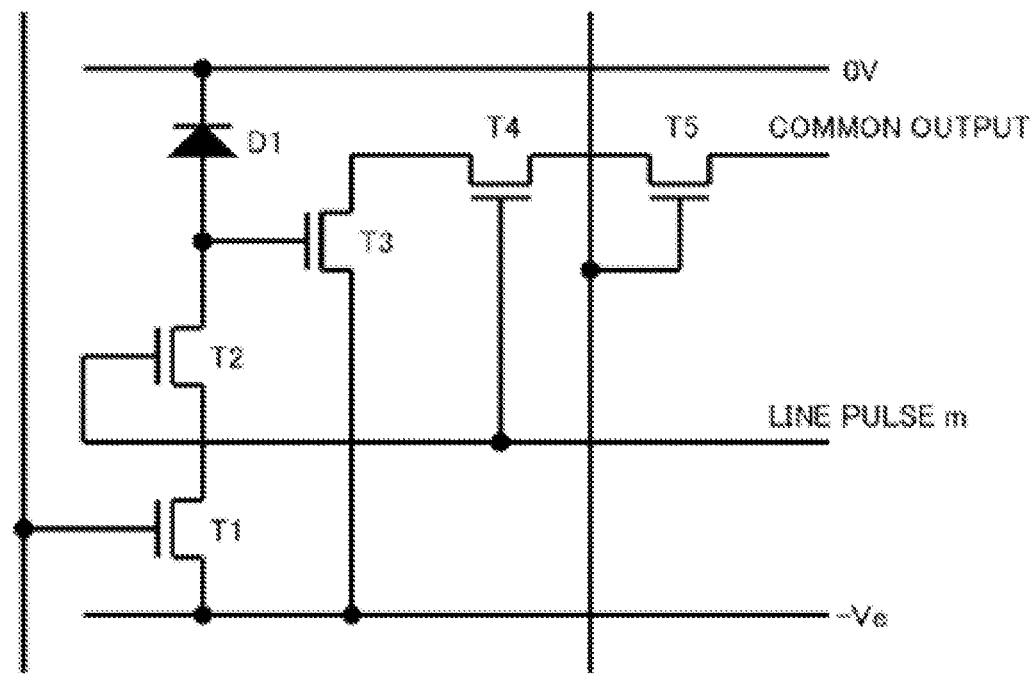
FIG. 16 is a circuit diagram illustrating a pixel configuration of a conventional image sensor.

FIG. 15 illustrates a device structure where the direct conversion type is used as a photoelectric converter in the image sensor of the present invention.

A process up to formation of a transistor is the same as in the indirect conversion type. On an interlayer film 525, a lower electrode 530 is laminated, followed by patterning. As the lower electrode 530, Cr, Al alloy, or the like is usable. Thereafter, a photoconductive layer 570 is laminated. As the photoconductive layer 570, CdSe or the like is usable. Thereon, a metal film to serve as an upper electrode 580 is laminated. As the upper electrode 580, ITO, Al, or the like is usable, however, it is desirable to select one having a small atomic number in view of transmittance of X-rays.

Contact holes for electrically connecting various metal films are formed in the gate insulating film 521, the interlayer film 525, and the like, as necessary.

REFERENCE SIGNS LIST

100 Image sensor
200 Pixel
210 Photoelectric converter
211 Resetting transistor
212 Photodiode
213 Photoconductive layer
214 Capacitor
220 Amplifying transistor
230 Reading transistor
240 Controller
241, 242, 243, 244 Transistor
245 Capacitor
300 Reading circuit
310 Operational amplifier
311, 312 Resistance
400 Scanning circuit
510 Substrate
520 Gate metal
521 Gate insulating film
522 Oxide semiconductor layer
523 Channel protective film
524 Source and drain metal
525 Interlayer film
530 Lower electrode
540 n+a-Si
541 i–a-Si
542 p+a-Si
550, 580 Upper electrode
551 Planarizing film
552 Bias wiring
553 Protective film
560 Phosphor
570 Photoconductive layer

The invention claimed is:

1. An amplifier circuit outputting current in accordance with voltage applied to an input terminal thereof, the amplifier circuit comprising:
    at least one transistor including
    a gate terminal connected to the input terminal and
    a source terminal connected to an output terminal of the amplifier circuit,
    wherein the amplifier circuit performs an operation including an output period of outputting a signal and a stop period of outputting no signal,
    wherein during the stop period,
    a controller controls potential of the source terminal of the transistor to be equal to potential of a drain terminal of the transistor and
    potential of the drain terminal of the transistor is always higher than potential of the gate terminal thereof.

2. The amplifier circuit according to claim 1,
    wherein the transistor is formed with an oxide semiconductor.

3. An image sensor comprising an amplifier circuit and a photoelectric converter in each pixel,
    wherein the photoelectric converter includes a photoelectric conversion device and a first transistor connected in series,
    the amplifier circuit includes a second transistor including a gate terminal connected to a junction of the photoelectric conversion device and the first transistor and a source terminal connected to a reading wiring via a third transistor,
    the first transistor functions to reset the photoelectric conversion device at constant potential by a first control signal, and
    the third transistor functions to output an output of the amplifier circuit to the reading wiring by a second control signal,
    wherein during a period other than a period of outputting the output of the amplifier circuit to the reading wiring,
    a controller controls potential of the source terminal of the second transistor to be equal to potential of a drain terminal thereof, and
    the potential of the drain terminal of the second transistor is always higher than potential of the gate terminal thereof.

4. The image sensor according to claim 3,
    wherein the controller comprises a fourth transistor connected in parallel to the source terminal and the drain terminal of the second transistor and
    a gate terminal of the fourth transistor is controlled by a third control signal differing from the first control signal and the second control signal.

5. The image sensor according to claim 3,
wherein the controller comprises a fourth transistor connected in parallel to the source terminal and the drain terminal of the second transistor,
a fifth transistor including a drain terminal and a gate terminal connected to the first control signal and a source terminal connected to a gate terminal of the fourth transistor, and
a sixth transistor including a gate terminal connected to the second control signal, a source terminal connected to a power supply, and a drain terminal connected to the gate terminal of the fourth transistor.

6. The image sensor according to claim 3,
wherein the controller comprises a seventh transistor and a first capacitor connected in series, and
the seventh transistor includes a gate terminal connected to the first control signal, a drain terminal connected to the drain terminal of the second transistor, and a source terminal connected to the source terminal of the second transistor.

7. The image sensor according to claim 3,
wherein at least the second transistor is formed with an oxide semiconductor.

8. The image sensor according to claim 3,
wherein the photoelectric conversion device comprises a photodiode and a phosphor.

9. The image sensor according to claim 3,
wherein the photoelectric conversion device comprises a photoconductive layer sandwiched by two electrodes and a second capacitor connected in series to the photoconductive layer, and
the drain terminal of the first transistor is connected to a junction of the photoconductive layer and the second capacitor.

* * * * *